(12) United States Patent
Jones et al.

(10) Patent No.: US 6,531,782 B1
(45) Date of Patent: Mar. 11, 2003

(54) METHOD OF PLACING DIE TO MINIMIZE DIE-TO-DIE ROUTING COMPLEXITY ON A SUBSTRATE

(75) Inventors: Christopher W. Jones, Pleasanton, CA (US); Andrew J. Wright, Mountain View, CA (US)

(73) Assignee: Cypress Semiconductor Corp., San Jose, CA (US)

( * ) Notice: Subject to any disclaimer, the term of this patent is extended or adjusted under 35 U.S.C. 154(b) by 0 days.

(21) Appl. No.: 09/884,330

(22) Filed: Jun. 19, 2001

(51) Int. Cl.[7] .................... H01L 23/49; H01L 23/52; H01L 23/48; H01L 27/06
(52) U.S. Cl. .................. 257/773; 257/723; 257/797; 257/730; 257/786; 257/203; 257/208; 257/728; 257/735; 257/685
(58) Field of Search .................. 257/723, 728, 257/735, 776, 786, 678, 797, 685, 773, 730, 203, 208

(56) References Cited

U.S. PATENT DOCUMENTS

| | | | |
|---|---|---|---|
| 4,868,634 A | 9/1989 | Ishida et al. .................. 357/68 |
| 5,138,434 A | 8/1992 | Wood et al. .................. 357/74 |
| 5,189,505 A | 2/1993 | Bartelink .................... 257/419 |
| 5,291,061 A | 3/1994 | Ball ........................... 257/686 |
| 5,323,060 A | 6/1994 | Fogal et al. ................ 257/777 |
| 5,331,235 A | 7/1994 | Chun .......................... 257/777 |
| 5,399,898 A | 3/1995 | Rostoker .................... 257/499 |
| 5,422,435 A | 6/1995 | Takiar et al. ............... 174/52.4 |
| 5,438,224 A | 8/1995 | Papageorge et al. ........ 257/777 |
| 5,477,082 A | 12/1995 | Buckley, III et al. ....... 257/679 |
| 5,525,834 A * | 6/1996 | Fischer et al. .............. 257/691 |
| 5,585,668 A | 12/1996 | Burns ......................... 257/676 |
| 5,594,626 A | 1/1997 | Rostoker et al. ............ 361/784 |
| 5,615,475 A | 4/1997 | Burns .......................... 29/827 |
| 5,777,345 A * | 7/1998 | Loder et al. ................. 257/777 |
| 5,790,384 A | 8/1998 | Ahmad et al. .............. 361/760 |
| 5,874,781 A | 2/1999 | Fogal et al. ................ 257/777 |
| 5,894,165 A | 4/1999 | Ma et al. .................... 257/666 |
| 5,936,305 A | 8/1999 | Akram ........................ 257/723 |
| 5,963,794 A | 10/1999 | Fogal et al. ................ 438/108 |
| RE36,469 E | 12/1999 | Wood et al. ................. 257/685 |
| 6,048,750 A | 4/2000 | Hembree .................... 438/107 |
| 6,051,886 A | 4/2000 | Fogal et al. ................ 257/777 |
| 6,080,264 A | 6/2000 | Ball ........................... 156/292 |
| 6,118,670 A * | 9/2000 | Radford et al. ............. 361/777 |
| 6,127,726 A | 10/2000 | Bright et al. ............... 257/691 |
| 6,150,724 A | 11/2000 | Wenzel et al. .............. 257/777 |
| 6,160,718 A | 12/2000 | Vakilian ..................... 361/803 |
| 6,166,464 A | 12/2000 | Grant ........................ 310/68 R |
| 6,175,149 B1 | 1/2001 | Akram ........................ 257/777 |
| 6,175,161 B1 | 1/2001 | Goetz et al. ................ 257/780 |
| 6,207,467 B1 | 3/2001 | Vaiyapuri et al. ............ 438/15 |
| 6,211,462 B1 * | 4/2001 | Carter, Jr. et al. ......... 174/52.4 |
| 6,211,960 B1 | 4/2001 | Hembree .................... 356/400 |

FOREIGN PATENT DOCUMENTS

JP        02001102472 A  *  4/2001  ........... H01L/23/02

\* cited by examiner

*Primary Examiner*—Nathan J. Flynn
*Assistant Examiner*—Johannes P Mondt
(74) *Attorney, Agent, or Firm*—Christopher P. Maiorana, P.C.

(57) ABSTRACT

A method of fabricating a semiconductor package that may contain two or more dies. The method generally comprises the steps of (A) mounting a first die having a first side on an assembly apparatus and (B) mounting a second die having a second side and an adjoining third side on said assembly apparatus. The second die may be oriented such that (i) the second side and the third side both face the first side and (ii) the second side and the third side are both substantially nonparallel to the first side.

16 Claims, 3 Drawing Sheets

METHOD OF PLACING DIE TO MINIMIZE DIE-TO-DIE ROUTING COMPLEXITY ON A SUBSTRATE

FIELD OF THE INVENTION

The present invention relates to a method and/or architecture for die placement on a substrate generally and, more particularly, to rotating the die to minimize die-to-die routing complexity.

BACKGROUND OF THE INVENTION

Conventional multi-die semiconductor packages are organized internally about Cartesian coordinates. Dies are mounted to a substrate with the die sides aligned along an imaginary X-Y grid. Traces on the substrate carrying inter-die signals are also aligned along the imaginary X-Y grid with some corners being shortened by 45 degree routes. One consequence of the imaginary X-Y grid is that some traces on the substrate follow long and complex routes. The long and complex routes cause signal propagation delays, add to fabrication expenses, reduce reliability, and contribute to crosstalk.

A typical approach to reducing routing complexity is to align two dies so that high priority inter-die traces route between parallel facing sides of the dies. The resulting traces are short and straight thus contribute little to propagation delays and crosstalk. The parallel facing side approach is effective only when the high priority inter-die signals bonding pads are on only one side of each die. In situations where the high priority signal bonding pads are scattered across two or more die sides, then the signals of the non-facing sides must be routed over longer, more complex traces.

SUMMARY OF THE INVENTION

The present invention concerns a method of fabricating a semiconductor package that may contain two or more dies. The method generally comprises the steps of (A) mounting a first die having a first side on an assembly apparatus and (B) mounting a second die having a second side and an adjoining third side on said assembly apparatus. The second die may be oriented such that (i) the second side and the third side both face the first side and (ii) the second side and the third side are both substantially nonparallel to the first side.

The objects, features and advantages of the present invention include providing a method and architecture for mounting two dies on an assembly apparatus that may (i) reduce inter-die connection complexity, (ii) increase inter-die communication speeds, (iii) increase reliability, and/or (iv) reduce crosstalk.

BRIEF DESCRIPTION OF THE DRAWINGS

These and other objects, features and advantages of the present invention will be apparent from the following detailed description and the appended claims and drawings in which:

DETAILED DESCRIPTION OF THE PREFERRED EMBODIMENTS

Figure 1:
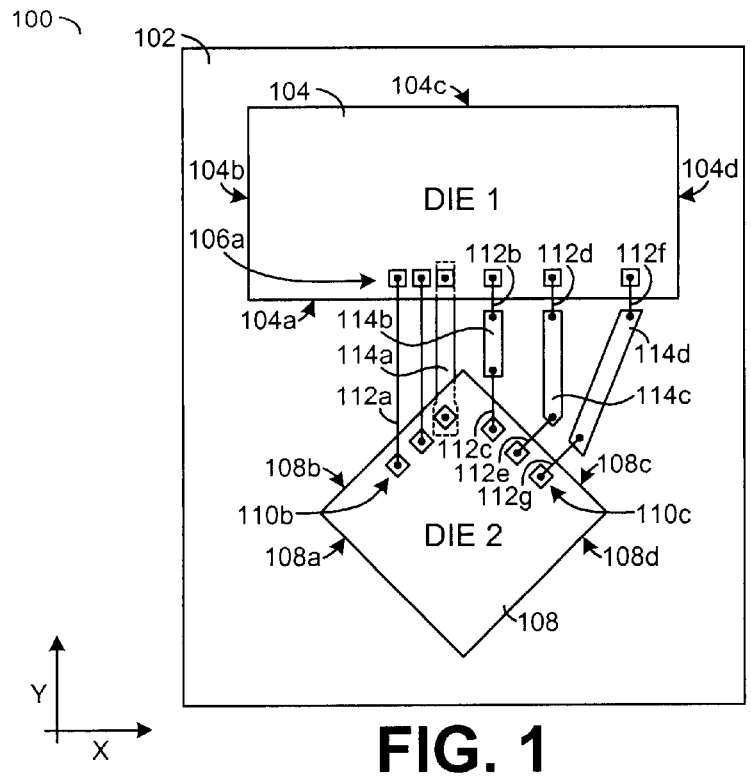
FIG. 1 is a block diagram of a first device implementing the present invention.

Referring to FIG. 1, a block diagram of a device 100 is shown in accordance with a preferred embodiment of the present invention. The device 100 may be implemented as a semiconductor package housing two or more dies on an assembly apparatus 102. The assembly apparatus 102 may be implemented as a ceramic substrate, a metal or plastic housing, or the like.

The semiconductor package 100 may have a first die 104 mounted on the assembly apparatus 102. The first die 104 may be oriented to a reference X-Y grid of the semiconductor package 100. The first die 104 may have a generally rectangular shape, including a square shape. The sides of the first die 104 may be referenced as a side 104A, a side 104B, a side 104C, and a side 104D. Other shaped die may be used to meet the design criteria of a particular application. The first die 104 may have one or more interfaces 106A located along the side 104A. Each interface 106A may be implemented as a bonding pad, solder bump, or equivalent input and/or output structure.

A second die 108 may also be mounted on the assembly apparatus 102 within the semiconductor package 100. The second die 108 may be oriented at an angle to the reference X-Y grid. As a result, the second die 108 may be oriented at the angle with respect to the first die 104 as measured from die side to die side. The second die 108 may have a generally rectangular shape, including a square shape. The sides of the second die 108 may be referenced as a side 108A, a side 108B, a side 108C, and a side 108D. Other shaped die may be used to meet the design criteria of a particular application. The second die 108 may have one or more interfaces 110B located along the side 108B and one or more interfaces 110C located along the side 108C. Each interface 110 may be implemented as a bonding pad, solder bump, or equivalent input and/or output structure.

The second die 108 may be positioned with respect to the first die 104 to minimize a routing complexity between (i) the interfaces 106A and 110B and (ii) the interfaces 106A and 110C. The second die 108 may have two adjoining sides (e.g., side 108B and side 108C) facing one side (e.g., side 104A) of the first die 104. The second die 108 may be oriented with respect to the first die 104 such that the two sides 108B–C of the second die 108 may be substantially nonparallel to the side 104A of the first die 104. In one embodiment, the second die 108 is rotated such that the side 108B is at an approximately 45-degree angle with respect to the side 104A of the first die 104.

Generally, a rotation of approximately 10 degrees or greater between the side 104A and one of the sides 108B or 108C may be required to have both sides 108B and 108C face the side 104A. Rotations smaller than approximately half of the 10 degrees may be attributable to normal mounting misalignments of the first die 104 and the second die 108. Therefore, side-to-side orientations of approximately 5 degrees or less may be considered parallel.

The alignment of the first die 104 with respect to the second die 108 may account for positioning of the interfaces 106A with respect to the interfaces 110B–C. In one embodiment, the interfaces 106A are aligned with the interfaces 110B–C along non-low crossing straight lines. The individual straight lines may be parallel and/or nonparallel to each other. Some advantages of straight line routes include, but are not limited to, ease of fabrication, reliability, and speed. In other embodiments, some interfaces may not be connectable along non-crossing straight lines.

The first die 104 and the second die 108 may be positioned close to each other so that distances between the interfaces 106A and the interfaces 110B–C are short. The short interface distances may result in short connection lengths. Some advantages of short connections include, but are not limited to, speed and minimal crosstalk.

Signals may be conveyed between the first die 104 and the second die 108 by a variety of mechanisms. One mechanism may be to connect a wire bond, lead beam, trace, or the like, directly from an interface 106A to an interface 110B or 110C. An example of a direct die-to-die wire bond may be represented by a wire 112A. Another example of a direct die-to-die trace may be represented by a trace 114A where the die 104 and the die 108 are flip-chip mounted. Another example of a mechanism to carry inter-die signals may be to connect (i) a wire 112B from an interface 106A to a trace 114B and (ii) another wire 112C from the trace 114B to an interface 110C. The wire 112B, trace 114B and wire 112C may form a straight line.

An example of an inter-die connection having two straight segments may be illustrated using a wire 112D, a trace 114C and another wire 112E. The wire 112D may be connect an interface 106A to the trace 114C and the wire 112E may connect an interface 110C to the trace 114B. A first junction of the trace 114C and the wire 112D may form a straight line. However, a second junction of the trace 114C and the wire 112E may form a shallow corner giving the route two straight segments.

The trace 114C may allow the wire 112E to be positioned perpendicular to substantially tangential (e.g., 60 degrees to 120 degrees) with respect to the side 108C. Neighboring wires 112 similarly routed may therefore be parallel to each other. Routing the wires 112 perpendicular or near-perpendicular to the side 108C may allow for close spacing of the wires 112 while maintaining a minimum required wire-to-wire separation.

An example illustrating an inter-die connection having three straight segments may be provided by a wire 112F, a trace 114D, and a wire 112G. The wire 112F may connect an interface 106A to the trace 114D. A first junction of the wire 112F and the trace 114D may form a first corner. The wire 112G may connect an interface 110C to the trace 114D. A second junction of the wire 112G and the trace 114D may form a second corner. Using multi-segmented routes may allow for optimal placement of the bond wires 112 without significantly impacting signal characteristics. Other connections have other numbers of segments may be implemented to meet the design criteria of a particular application.

Figure 2:
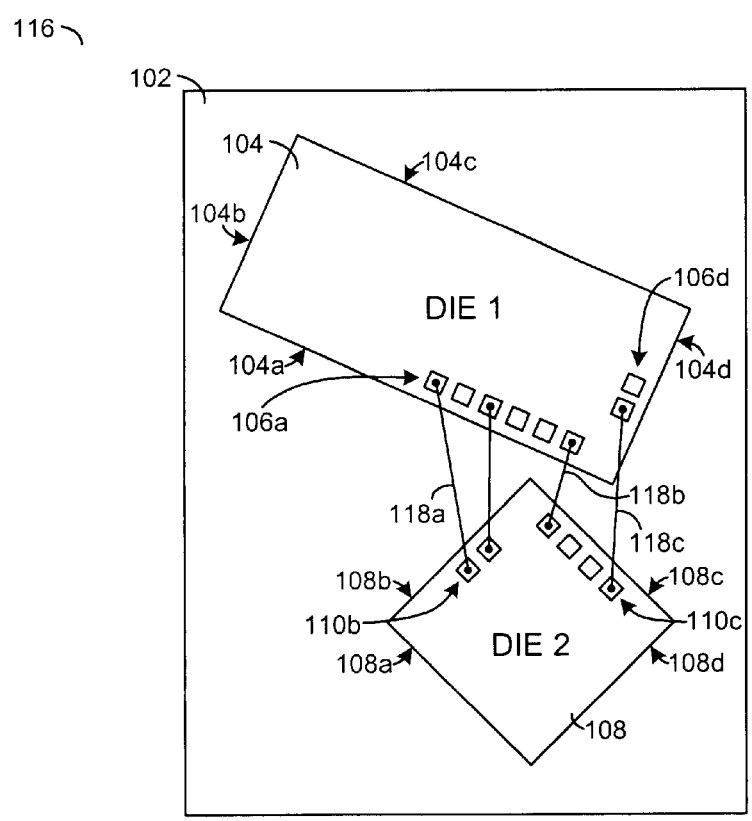
FIG. 2 is a block diagram of a second device.

Referring to FIG. 2, a block diagram of another semiconductor package 116 is shown. The semiconductor package 116 may comprise the assembly apparatus 102, the first die 104, and the second die 108. In the semiconductor package 116, the first die 104 and second die 108 may be rotated and positioned with respect to each other such that two adjoining sides (e.g., side 104A and side 104D) of the first die 104 face two adjoining sides (e.g., side 108B and side 108C) of the second die 108.

A two-side-to-two-side orientation may allow for complex routing situations to be reduced to several straight line routes. For example, a connection 118A may be established along a straight path between an interface 106A on the side 104A and an interface 110B on the side 108B. Simultaneously, another connection 118B may be established along another straight path between another interface 106A on the side 104A and an interface 110C on the side 108C. Simultaneously, still another connection 118C may be established along still another straight path between an interface 106D on the side 104D and another interface 110C on the side 108C.

Figure 3:
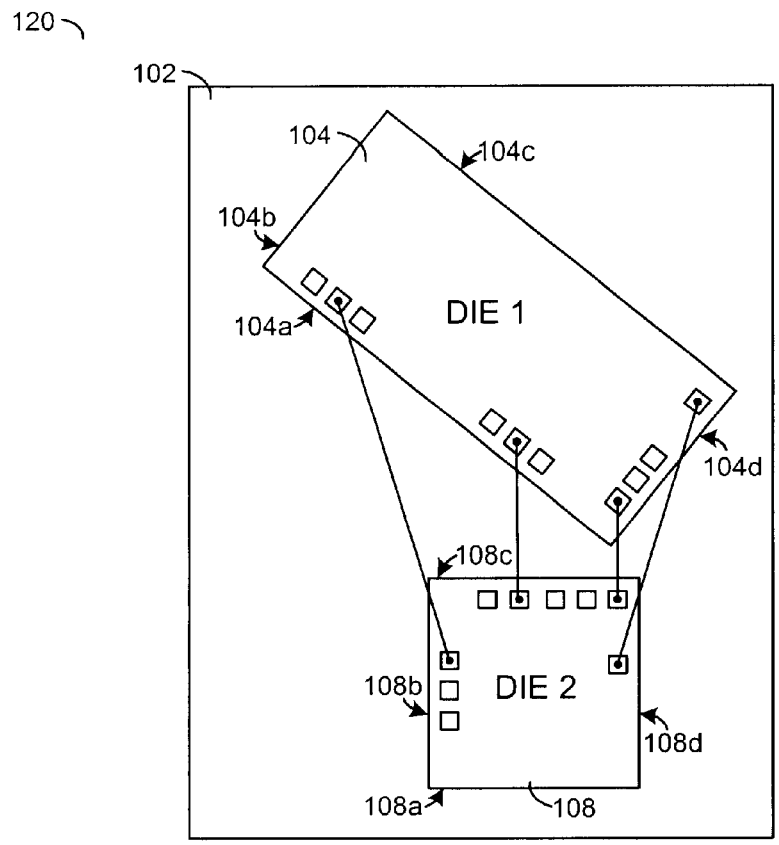
FIG. 3 is a block diagram of a third device.

Referring to FIG. 3, a block diagram of another semiconductor package 120 is shown. The semiconductor package 120 may include the assembly apparatus 102, the first die 104, and the second die 108. In the semiconductor package 120, the first die 104 and the second die 108 may be oriented with respect to each other such that two adjoining sides (e.g., side 104A and side 104D) of the first die 104 face three sides (e.g., side 108B, side 108C, and side 108D) of the second die 108. In particular, the side 104A may face the side 108B and the side 108C. Simultaneously, the side 104D may face the side 108C and the side 108D. For situations where the die 104 and/or the die 108 are non-rectangular shapes, an orientation between the die 104 and the die 108 may be established where three sides of the first die 104 face three sides of the second die 108.

Figure 4:
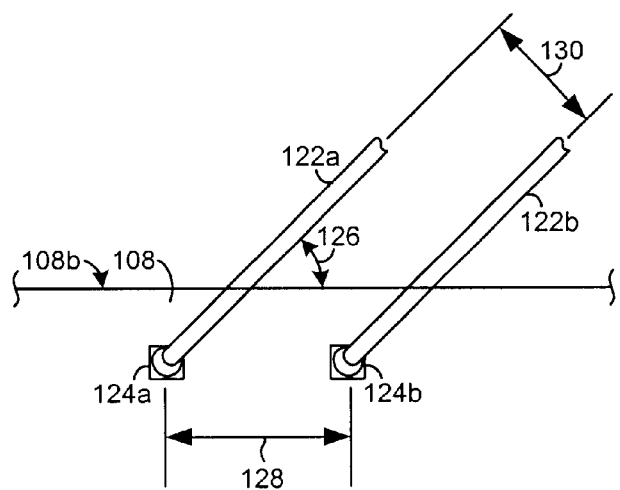
FIG. 4 is a drawing of part of a die.

Referring to FIG. 4, a drawing of part of the second die 108 is shown. Alignment of the first die 104 to the second die 108 may require consideration for straight line connections between the respective interfaces and other similar parameters. In one embodiment, a wire-to-wire separation criterion for wires 122 may limit rotation of the second die 108 with respect to the first die 104. A first wire 122A may be bonded to a first bonding pad 124A on the side 108B of the second die 108. A second wire 122B may be bonded to a second bonding pad 124B adjacent to the first bonding pad 124A on the side 108B. Each wire 122 may intersect the side 108B at an angle 126.

For a predetermined separation 128 between the first bonding pad 124A and the second bonding pad 124B and a minimum separation 130 between the first wire 122A and the second wire 122B, then the minimum angle 126 may be determined. For example, a predetermined center-to-center separation 128 between the bonding pads 124 and a minimum center-to-center separation 130 between the wires 122 of half the predetermined center-to-center separation 128 may limit the angle 126 to approximately 30 degrees. If the side 108B is at an approximately 30-degree angle to the side 104A, then the side 108C is at an approximately 60-degree angle to the side 104A. Reducing the minimum center-to-center separation 130 between wires 122 by approximately 10 percent may change the minimum value for the angle 126 to approximately 20 degrees. If the side 108B is at an approximately 20-degree angle with respect to the side 104A, then the side 108C may produce an approximately 70-degree angle with the side 104A. Where the first die 104 and/or the second die 108 are flip-chip mounted, the separation of interest may be between traces 114 of the assembly apparatus 102 that are connected to pads configured to receive the solder bumps.

Figure 5:
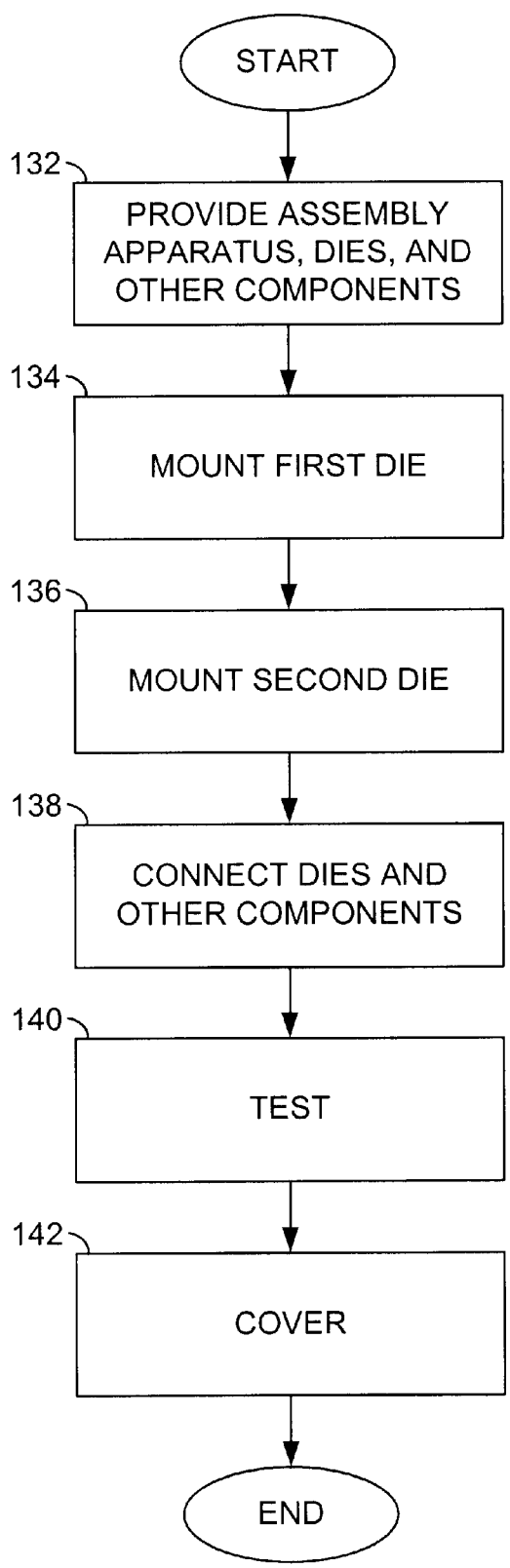
FIG. 5 is a flow diagram of a method of fabricating the first device.

Referring to FIG. 5, a flow diagram of a method of fabricating the semiconductor package 100 (FIG. 1) is shown. The process may begin be providing the assembly apparatus 102, the first die 104, the second die 108, and any other die and/or components (e.g., a lid, bonding wire, capacitors, resistors and such) to be used during the assembly (e.g., block 132). The first die 104 may be mounted on the assembly apparatus 102 with the side 104A facing a predetermined direction (e.g., block 134). The second die may be mounted on the assembly apparatus 102 with the two sides 108B–C facing the side 104A (e.g., block 136). The side 108B may form an angle between 10 degrees and 80 degrees with the side 104A. Any other electrical components may be mounted before or after mounting of the first die 104 and the second die 108. The interfaces 106A of the first die 104 may then be connected to the interfaces 110B and the interfaces 110C of the second die 108 (e.g., block 138). In one embodiment, the connections may be made be along straight lines. Connections may also be made to other components and I/O pins or beams. Once the connections have been made, the semiconductor package 100 may be tested (e.g., block 140). If the test passes, then the lid may be provided to enclose the first die 104 and the second die 108 (e.g., block 142).

While the invention has been particularly shown and described with reference to the preferred embodiments thereof, it will be understood by those skilled in the art that various changes in form and details may be made without departing from the spirit and scope of the invention.

What is claimed is:

1. A method of fabrication comprising the steps of:
   (A) mounting a first die having (i) a first side and ii) a fourth side adjoining said first side on an assembly apparatus; and
   (B) mounting a second die having (a) a second side, (b) a third side adjoining said second side and (c) a fifth side adjoining said second side and opposite said third side on said assembly apparatus, said second die being oriented such that (i) said second side and said third side both face said first side, (ii) said second side and said third side are both substantially nonparallel to said first side, (iii) said second side also faces said fourth side and (iv) said fifth side faces said first side.

2. The method according to claim 1, further comprising the step of connecting a plurality of first side interfaces to (i) a second side interface along a first straight line and (ii) a third side interface along a second straight line parallel to said first straight line.

3. The method according to claim 1, further comprising the steps of;
   connecting a first side interface to a second side interface along a first straight line; and
   connecting a third side interface to a fourth side interface along a second straight line.

4. The method according to claim 1, further comprising the steps of:
   connecting a plurality of first side interfaces to (i) a second side interface along a first straight line and (ii) a fifth side interface along a second straight line; and
   connecting a third side interface to a fourth side interface along a third straight line.

5. The method according to claim 1, wherein substantially nonparallel is at least ten degrees.

6. The method according to claim 1, wherein said second side is oriented in a range from 20 to 70 degrees with respect to said first side.

7. The method according to claim 1, wherein said second side is oriented in a range from 30 to 60 degrees with respect to said first side.

8. The method according to claim 1, wherein said second side is oriented at approximately 45 degrees with respect to said first side.

9. A semiconductor package comprising:
   an assembly apparatus;
   a first die having (i) a first side and (ii) a fourth side adjoining said first side disposed on said assembly apparatus; and
   a second die having (a) a second side, (b) a third side adjoining said second side and (c) a fifth side adjoining said second side and opposite said third side disposed on said assembly apparatus, said second die being oriented such that (i) said second side and said third side both face said first side, (ii) said second side and said third side are both substantially nonparallel to said first side, (iii) said third side also faces said fourth side and (iv) said fifth side faces said first side.

10. The semiconductor package according to claim 9, further comprising a plurality of parallel straight-line connections connecting a plurality of first side interfaces to (i) a second side interface and (ii) a third side interface.

11. The semiconductor package according to claim 9, further comprising a plurality of straight-line connections connecting (i) a first side interface to a second side interface and (ii) a third side interface to a fourth side interface.

12. The semiconductor package according to claim 9, further comprising a plurality of straight-line connections connecting (i) a plurality of first side interfaces to a second side interface and a fifth side interface and (ii) a third side interface to a fourth side interface.

13. The semiconductor package according to claim 9, wherein substantially nonparallel is at least ten degrees.

14. The semiconductor package according to claim 9, wherein said second side is oriented in a range from 20 to 70 degrees with respect to said first side.

15. The semiconductor package according to claim 9, wherein said second side is oriented in a range from 30 to 60 degrees with respect to said first side.

16. The semiconductor package according to claim 9, wherein said second side is oriented at approximately 45 degrees with respect to said first side.

\* \* \* \* \*